United States Patent
Su

(10) Patent No.: US 12,094,562 B2
(45) Date of Patent: Sep. 17, 2024

(54) SENSE AMPLIFIER, MEMORY, AND CONTROL METHOD

(71) Applicant: CHANGXIN MEMORY TECHNOLOGIES, INC., Hefei (CN)

(72) Inventor: Hsin-Cheng Su, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 193 days.

(21) Appl. No.: 17/647,995

(22) Filed: Jan. 14, 2022

(65) Prior Publication Data

US 2022/0310134 A1    Sep. 29, 2022

Related U.S. Application Data

(63) Continuation of application No. PCT/CN2021/107523, filed on Jul. 21, 2021.

(30) Foreign Application Priority Data

Mar. 24, 2021  (CN) .......................... 202110313685.5

(51) Int. Cl.
  *G11C 7/08* (2006.01)
  *G11C 7/06* (2006.01)
  *G11C 7/12* (2006.01)

(52) U.S. Cl.
  CPC ................ *G11C 7/08* (2013.01); *G11C 7/062* (2013.01); *G11C 7/12* (2013.01)

(58) Field of Classification Search
  CPC .............. G11C 7/062; G11C 7/12; G11C 7/08
  (Continued)

(56) References Cited

U.S. PATENT DOCUMENTS

| 5,526,313 A | 6/1996 | Etoh et al. |
| 5,544,110 A | 8/1996 | Yuh |

(Continued)

FOREIGN PATENT DOCUMENTS

| CN | 1496568 A | 5/2004 |
| CN | 101140798 A | 3/2008 |

(Continued)

OTHER PUBLICATIONS

International Search Report in PCT/CN2021/107523 mailed Dec. 8, 2021, 10 pages.

(Continued)

*Primary Examiner* — Sung Il Cho
(74) *Attorney, Agent, or Firm* — Sheppard Mullin Richter & Hampton LLP

(57) ABSTRACT

The present application provides a sense amplifier, a memory, and a control method. The sense amplifier includes: an amplification module, configured to: amplify a voltage difference between a bit line and a reference bit line; and a controlled power supply module, connected to the amplification module, and configured to: determine a drive parameter according to a first rated pull rate range and a second rated pull rate range, and supply power to the amplification module according to the drive parameter, to control the amplification module to pull a voltage of the bit line or a voltage of the reference bit line to a first preset value at a first rated pull rate at the amplification stage and pull the voltage of the reference bit line or the voltage of the bit line to a second preset value at a second rated pull rate at the amplification stage.

17 Claims, 7 Drawing Sheets

(58) Field of Classification Search
USPC .......................................................... 365/207
See application file for complete search history.

(56) References Cited

U.S. PATENT DOCUMENTS

| | | | |
|---|---|---|---|
| 5,659,260 A * | 8/1997 | Kajimoto | G05F 1/577 |
| | | | 327/54 |
| 6,147,916 A | 11/2000 | Ogura | |
| 6,819,600 B2 | 11/2004 | Sim | |
| 6,847,568 B2 | 1/2005 | Gogl et al. | |
| 7,394,714 B2 | 7/2008 | Lin et al. | |
| 7,663,953 B2 | 2/2010 | Cheng et al. | |
| 8,817,528 B2 | 8/2014 | Otto et al. | |
| 9,390,793 B1 | 7/2016 | Nigam et al. | |
| 9,431,071 B2 | 8/2016 | Moon et al. | |
| 9,449,680 B2 | 9/2016 | Huang | |
| 10,388,355 B1 | 8/2019 | Ware et al. | |
| 11,024,365 B1 | 6/2021 | Seo et al. | |
| 2003/0021171 A1 | 1/2003 | Beigel et al. | |
| 2007/0076501 A1* | 4/2007 | Kang | G11C 7/065 |
| | | | 365/208 |
| 2008/0225617 A1 | 9/2008 | Cheng et al. | |
| 2011/0205812 A1 | 8/2011 | Kajigaya | |
| 2011/0235402 A1 | 9/2011 | Ueda | |
| 2011/0255359 A1 | 10/2011 | Sachdev et al. | |
| 2012/0081986 A1 | 4/2012 | Joo et al. | |
| 2016/0012868 A1* | 1/2016 | Moon | G11C 7/065 |
| | | | 365/189.11 |
| 2016/0163364 A1* | 6/2016 | Lee | G11C 7/12 |
| | | | 365/189.11 |
| 2017/0018295 A1 | 1/2017 | Kim | |
| 2017/0133084 A1* | 5/2017 | Hwang | G11C 11/4091 |
| 2018/0233192 A1* | 8/2018 | Won | G11C 7/08 |
| 2019/0362760 A1 | 11/2019 | Lin et al. | |
| 2020/0075082 A1 | 3/2020 | Derner | |
| 2021/0005243 A1 | 1/2021 | Bae | |
| 2021/0366523 A1* | 11/2021 | Wang | G11C 7/02 |

FOREIGN PATENT DOCUMENTS

| | | |
|---|---|---|
| CN | 102394094 A | 3/2012 |
| CN | 101562042 B | 6/2012 |
| CN | 102881318 A | 1/2013 |
| CN | 103021455 A | 4/2013 |
| CN | 103123808 A | 5/2013 |
| CN | 103594111 A | 2/2014 |
| CN | 105976859 A | 9/2016 |
| CN | 106205676 A | 12/2016 |
| CN | 109712651 A | 5/2019 |
| CN | 111739565 A | 10/2020 |
| CN | 111863049 A | 10/2020 |
| CN | 111863052 A | 10/2020 |
| CN | 111863053 A | 10/2020 |
| CN | 111863055 A | 10/2020 |
| CN | 112447208 A | 3/2021 |
| CN | 112992200 A | 6/2021 |
| CN | 112992201 A | 6/2021 |
| CN | 112992202 A | 6/2021 |
| CN | 112992203 A | 6/2021 |
| CN | 113012729 A | 6/2021 |
| EP | 3940701 A1 | 1/2022 |
| JP | S58102389 A | 6/1983 |
| JP | H8-63978 A | 3/1996 |
| JP | 2002-25268 A | 1/2002 |
| KR | 20040003210 A | 1/2004 |
| KR | 20070084781 A | 8/2007 |
| KR | 10-2016-0006509 A | 1/2016 |
| TW | M358390 U | 6/2009 |
| WO | 2021036104 A1 | 3/2021 |

OTHER PUBLICATIONS

European Search Report cited in EP21859351, mailed Dec. 19, 2022, 11 pages.
First Office Action cited in CN 202110314347.3, mailed Feb. 22, 2022, 17 pages.
International Search Report in PCT/CN2021/107522 mailed Nov. 17, 2021, 9 pages.
International Search Report in PCT/CN2021/107681 mailed Nov. 30, 2021, 10 pages.
International Search Report in PCT/CN2021/107679 mailed Dec. 16, 2021, 10 pages.
International Search Report in PCT/CN2021/107888 mailed Dec. 23, 2021, 10 pages.
Request for the Submission of an Opinion dated May 30, 2024, issued in related Korean Patent Application No. 10-2022-7022183, with English machine translation (19 pages).
Request for the Submission of an Opinion dated Jun. 25, 2024, issued in related Korean Patent Application No. 10-2022-7026505, with English machine translation (15 pages).
Non-Final Office Action dated Oct. 25, 2023, issued in related U.S. Appl. No. 17/655,323 (23 pages).
Final Office Action dated Jan. 24, 2024, issued in related U.S. Appl. No. 17/655,323 (12 pages).
Extended European Search Report dated Jul. 7, 2023, issued in related European Patent Application No. 21904625.7 (10 pages).
Notice of Reasons for Refusal dated Jun. 13, 2023, issued in related Japanese Patent Application No. 2022-544414, with English machine translation (11 pages).

* cited by examiner

SENSE AMPLIFIER, MEMORY, AND CONTROL METHOD

CROSS-REFERENCE TO RELATED APPLICATIONS

The present application is a continuation application of International Patent Application No. PCT/CN2021/107523, titled "SENSE AMPLIFIER, MEMORY, AND CONTROL METHOD" and filed on Jul. 21, 2021, which claims the priority to Chinese Patent Application No. 202110313685.5, titled "SENSE AMPLIFIER, MEMORY, AND CONTROL METHOD" and filed with the China National Intellectual Property Administration (CNIPA) on Mar. 24, 2021. The entire contents of International Patent Application No. PCT/CN2021/107523 and Chinese Patent Application No. 202110313685.5 are incorporated herein by reference.

TECHNICAL FIELD

The present application relates to, but is not limited to, a sense amplifier, a memory, and a control method.

BACKGROUND

With the popularity of electronic devices such as cell phones, tablets, and personal computers, semiconductor memory technologies are also developing rapidly.

A sense amplifier (SA) is an important composition part of a semiconductor memory, which mainly functions to amplify a small signal on a bit line, to further perform a read or write operation.

However, in a process of reading data, it is easy to fail to read the data or to read the data incorrectly.

SUMMARY

An embodiment of the present application provides a sense amplifier, including:

an amplification module, configured to: when the sense amplifier is at an amplification stage, amplify a voltage difference between a bit line and a reference bit line; and a controlled power supply module, connected to the amplification module, and configured to: determine a drive parameter according to a first rated pull rate range of the bit line and a second rated pull rate range of the reference bit line, and supply power to the amplification module according to the drive parameter, to control the amplification module to pull a voltage of the bit line or a voltage of the reference bit line to a first preset value at a first rated pull rate at the amplification stage and pull the voltage of the reference bit line or the voltage of the bit line to a second preset value at a second rated pull rate at the amplification stage, where the first rated pull rate is within the first rated pull rate range, and the second rated pull rate is within the second rated pull rate range.

An embodiment of the present application provides a memory, including the sense amplifier in the foregoing embodiment of the present application and memory cells, a plurality of memory cells constitute a first storage array, a plurality of memory cells constitute a second storage array, the sense amplifier is located between the first storage array and the second storage array, a third terminal of the sense amplifier is connected to a bit line of the first storage array, and a fourth terminal of the sense amplifier is connected to a bit line of the second storage array.

The present application provides a control method, a sense amplifier includes an amplification module and a controlled power supply module; and the method includes:

obtaining a first rated pull rate range and a second rated pull rate range;

determining a drive parameter of the controlled power supply module according to the first rated pull rate range and the second rated pull rate range; and generating, according to the drive parameter, a control signal used to control the controlled power supply module, such that the controlled power supply module controls the amplification module to pull a voltage of a bit line or a voltage of a reference bit line to a first preset value at a first rated pull rate at an amplification stage and pull the voltage of the reference bit line or the voltage of the bit line to a second preset value at a second rated pull rate at an amplification stage, where the first rated pull rate is within the first rated pull rate range, and the second rated pull rate is within the second rated pull rate range.

DETAILED DESCRIPTION

In order to make the objectives, technical solutions and advantages of the present application clearer, the following clearly and completely describes the technical solutions in the present application with reference to the accompanying drawings in the present application. Apparently, the described embodiments are some rather than all of the embodiments of the present application. All other embodiments obtained by those of ordinary skill in the art based on the embodiments of the present application without creative efforts should fall within the protection scope of the present application.

Figure 1:
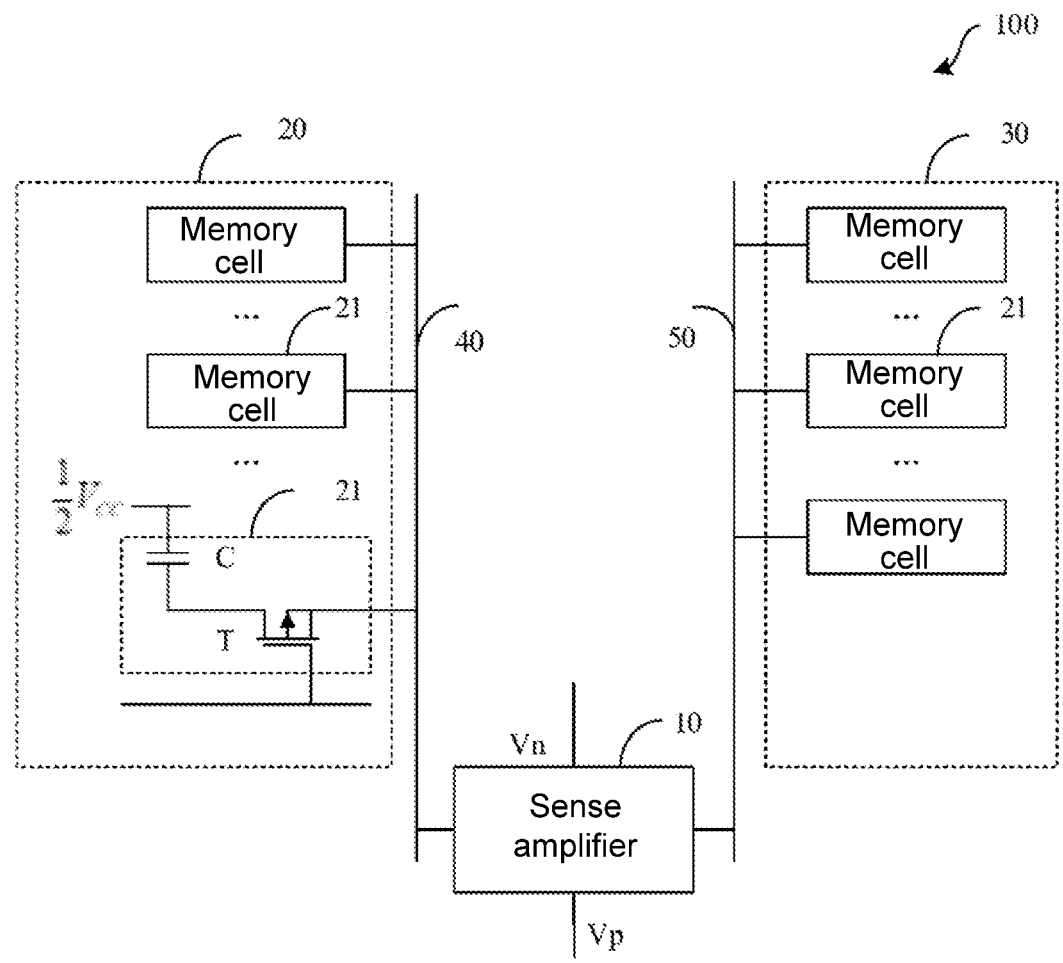
FIG. 1 is a schematic diagram of a circuit structure of a memory according to an embodiment of the present application.

As shown in FIG. 1, an embodiment of the present application provides a memory 100. The memory 100 includes a sense amplifier 10 and a plurality of memory cells 21. A plurality of memory cells 21 constitute a first storage array 20, and a plurality of memory cells 21 constitute a second storage array 30. Each memory cell 21 in the first storage array 20 is connected to a bit line 40 of the first storage array 20, and each memory cell 21 in the second storage array 30 is connected to a bit line 50 of the second storage array 30.

The sense amplifier 10 is located between the first storage array 20 and the second storage array 30, a first terminal of the sense amplifier 10 is connected to a first power supply terminal, a second terminal of the sense amplifier 10 is connected to a second power supply terminal, a third terminal of the sense amplifier 10 is connected to the bit line 40 of the first storage array 20, and a fourth terminal of the sense amplifier 10 is connected to the bit line 50 of the second storage array 30.

Each memory cell 21 is configured to store one-bit data, the bit line 40 of the first storage array 20 is configured to access data stored inside each memory cell 21 in the first storage array 20, and the bit line 50 of the second storage array 30 is configured to access data stored inside each memory cell 21 in the second storage array 30. The sense amplifier 10 is configured to amplify the data stored in each memory cell 21, and present the data on the bit line 40 of the first storage array 20 and the bit line 50 of the second storage array 30. The sense amplifier 10 is further configured to: after a data read operation is completed once, restore the memory cell 21 to a state before the read operation.

Each memory cell 21 includes a storage capacitor C and an access transistor T, a first terminal of the storage capacitor C is connected to a fixed power supply, which is, for example, $0.5V_{CC}$, a second terminal of the storage capacitor C is connected to a first terminal of the access transistor T, a second terminal of the access transistor T is connected to the bit line 40, and a control terminal of the access transistor T is connected to a word line.

1 and 0 in logic are represented by using a large and a small amount of charge stored in the storage capacitor C, or a high and low voltage difference between two ends of the storage capacitor C. The access transistor T is configured to control whether to allow or forbid to read or rewrite information stored in the storage capacitor C.

For ease of description, when data in a specific memory cell 21 in the first storage array 20 is read, the bit line of the first storage array 20 is referred to as a bit line 40, and the bit line of the second storage array 30 is referred to as a reference bit line 50. When data in a specific memory cell 21 in the second storage array 30 is read, the bit line of the second storage array 30 is referred to as a bit line 40, and the bit line of the first storage array 20 is referred to as a reference bit line 50.

Figure 2:
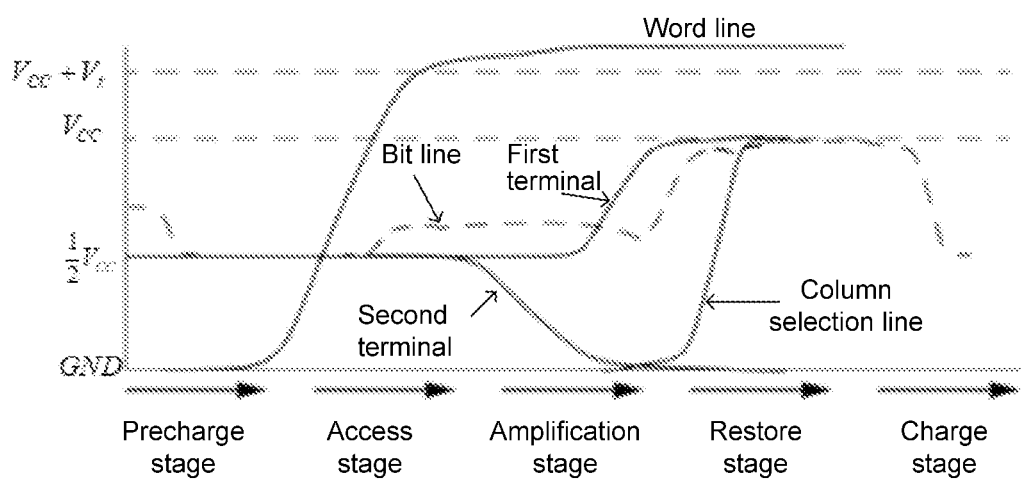
FIG. 2 is a time sequence diagram of data read according to another embodiment of the present application.

A process of reading data "1" from one memory cell 21 in the first storage array 20 is described below. As shown in FIG. 2, reading data includes a precharge stage, an access stage, an amplification stage, and a restore stage.

At the precharge stage, both a voltage of the bit line 40 of the first storage array 20 and a voltage of the reference bit line 50 are pulled up to a reference voltage, and the reference voltage is a voltage of a fixed power supply connected to the storage capacitor C, which is, for example, $0.5V_{CC}$.

At the access stage, a signal on a word line corresponding to the accessed memory cell 21 is controlled, such that an access transistor T in the accessed memory cell 21 is on, and the storage capacitor C enables the voltage of the bit line 40 to rise.

At the amplification stage, the voltage of the bit line 40 is higher than the reference voltage, such that the sense amplifier 10 pulls the voltage of the bit line 40 up to a first preset value, and pulls the voltage of the reference bit line 50 down to a second preset value, the voltage of the bit line 40 is higher than the voltage of the reference bit line 50, and a voltage difference between the bit line 40 and the reference bit line 50 may reflect that data in the accessed memory cell 21 is "1".

At the restore stage, the sense amplifier 10 stabilizes the voltages of the bit line 40 and the reference bit line 50 at logical data "1", the bit line 40 further charges the storage capacitor C, and after a specific time of charging, charge in the storage capacitor C is restored to a state before the read operation. Then, a signal inside a line is selected through a control column, such that an external read circuit may read the data stored in the accessed memory cell 21 on the bit line 40 and the reference bit line 50.

However, in a process of reading data in the memory cell 21, it is easy to fail to read the data or read the data incorrectly. To resolve the technical problem, the present application provides a sense amplifier, a memory, and a control method, aiming to provide a solution of improving data read accuracy and a data read success rate of the sense amplifier.

A technical concept of the present application is that the controlled power supply module controls rates at which the amplification module pulls the voltage of the bit line 40 and the voltage of the reference bit line 50, such that the pull rates of the voltage of the bit line 40 and the voltage of the reference bit line 50 are within a rated pull rate range, and the data stored in the memory cell 21 has been stably presented on the bit line 40 and the reference bit line 50 when the external read circuit reads the data presented on the bit line 40 and the reference bit line 50, thereby further improving a data read success rate and data read accuracy.

Figure 3:
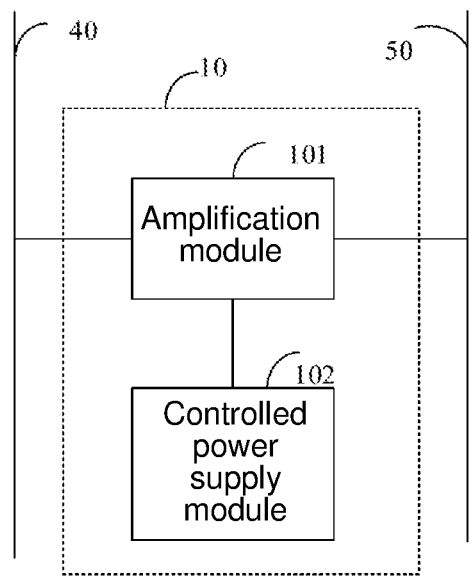
FIG. 3 is a schematic diagram of a circuit structure of a sense amplifier according to another embodiment of the present application.

As shown in FIG. 3, another embodiment of the present application provides a sense amplifier 10. The sense amplifier 10 includes an amplification module 101 and a controlled power supply module 102, and the amplification module 101 is connected to the controlled power supply module 102.

The amplification module 101 is configured to amplify a voltage difference between a bit line 40 and a reference bit line 50 when the sense amplifier 10 is at an amplification stage. The controlled power supply module 102 is configured to determine a drive parameter according to a first rated pull rate range and a second rated pull rate range, and supply power to the amplification module 101 according to the drive parameter.

Under control of the controlled power supply module 102, the amplification module 101 pulls a voltage of the bit line 40 or a voltage of the reference bit line 50 to a first preset value at a first rated pull rate and pulls the voltage of the reference bit line 50 or the voltage of the bit line 40 to a second preset value at a second rated pull rate at the amplification stage. The first rated pull rate is within the first rated pull rate range, and the second rated pull rate is within the second rated pull rate range. A difference between the first preset value and the second preset value can reflect logical data "1" or logical data "0".

To facilitate description of a process in which the sense amplifier reads data from a memory cell, it is assumed that when the first preset value is greater than the second preset value, it represents the logical data "1". The first preset value may be, for example, $V_{CC}$, and the second preset value may be, for example, 0.

When the logical data "1" is read from the memory cell 21, under control of the controlled power supply module 102, the amplification module 101 pulls the voltage of the bit line 40 to the first preset value at the first rated pull rate and pulls the voltage of the reference bit line 50 to the second preset value at the second rated pull rate at the amplification stage.

When the logical data "0" is read from the memory cell 21, under control of the controlled power supply module 102, the amplification module 101 pulls the voltage of the reference bit line 50 to the first preset value at the first rated pull rate and pulls the voltage of the bit line 40 to the second preset value at the second rated pull rate at the amplification stage.

In a process of reading data from the memory cell 21, a pull rate of the voltage of the bit line 40 and a pull rate of the voltage of the reference bit line 50 affect a data read success rate and data read accuracy.

Figure 4A:
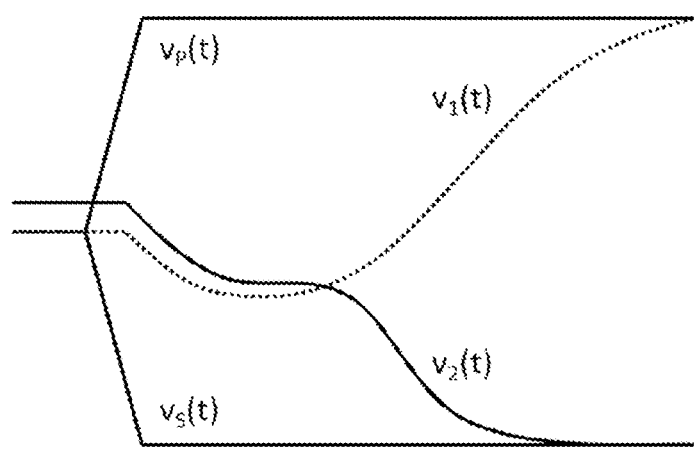
FIG. 4A, FIG. 4B, and FIG. 4C are each a schematic diagram of comparison between pull rates of a voltage of a bit line and a voltage of a reference bit line according to the present application.

As shown in FIG. 4A, if voltage pulling capabilities of a first terminal $v_p(t)$ and a second terminal $v_n(t)$ of the sense amplifier are excessively strong, pull rates of the voltage $v_1(t)$ of the bit line and the voltage $v_2(t)$ of the reference bit line are excessively high, resulting in occurrence of fluctuation in the voltage of the bit line and the voltage of the reference bit line, for example, the voltage of the bit line first decreases and then rises. In this case, data stored in the memory cell 21 cannot be stably presented on the bit line 40 and the reference bit line 50, to further cause an external read circuit to incorrectly read data on the bit line 40 and the reference bit line 50.

Figure 4B:
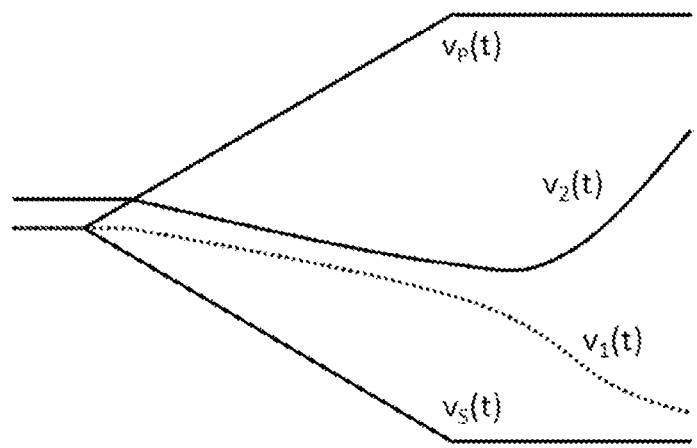

As shown in FIG. 4B, if voltage pulling capabilities of a first terminal $v_p(t)$ and a second terminal $v_n(t)$ of the sense amplifier are excessively weak, pull rates of the voltage $v_1(t)$ of the bit line and the voltage $v_2(t)$ of the reference bit line are excessively low, to further cause the voltages of the bit line 40 and the reference bit line 50 to fail to be pulled to a preset value when the external read circuit reads the voltages on the bit line 40 and the reference bit line 50, resulting in a data read failure.

Figure 4C:
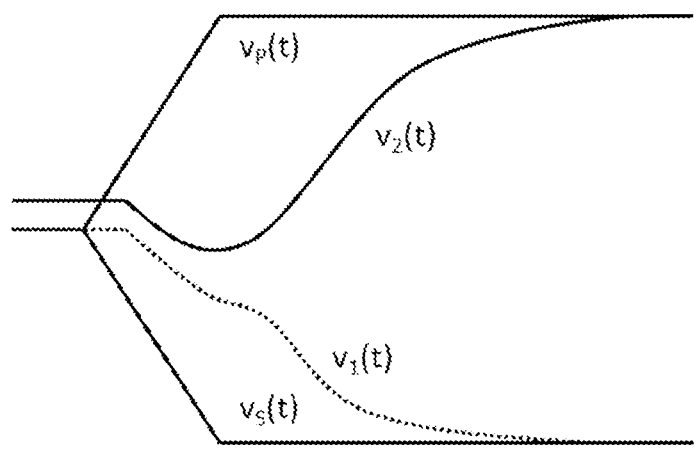

As shown in FIG. 4C, in this embodiment, the controlled power supply module 102 determines a drive parameter according to a first rated pull rate range and a second rated pull rate range, and supplies power to the amplification module 101 according to the drive parameter, to control the amplification module 101 to pull a voltage of the bit line 40 or a voltage of the reference bit line 50 to a first preset value at a first rated pull rate and pull the voltage of the reference bit line 50 or the voltage of the bit line 40 to a second preset value at a second rated pull rate at the amplification stage. The first rated pull rate is within the first rated pull rate range, and the second rated pull rate is within the second rated pull rate range.

The first rated pull rate range and the second rated pull rate range are determined according to a time sequence of selected signals on a column selection line, a time sequence of signals on a word line connected to the memory cell 21, and voltages of the bit line 40 and the reference bit line 50. The first rated pull rate range and the second rated pull rate range may be further obtained by testing the sense amplifier 10, to ensure that data on the bit line 40 and the reference bit line 50 can be accurately read. For example, as shown in FIG. 4A, FIG. 4B, and FIG. 4C, an embodiment is provided. It is assumed that a rising rate of $v_p(t)$ in FIG. 4A is 5 (a corresponding speed unit is V/μs), and a rising rate of $v_p(t)$ in FIG. 4B is 0.8 (a corresponding speed unit is V/μs). In this case, the first rated pull rate range may be from 2 to 4 (a corresponding speed unit is V/μs), and a first rated pull rate in FIG. 4C may be 3. It should be noted that one embodiment is merely provided herein, both the first rated pull rate range and the first rated pull rate are not limited thereto. Similarly, the second rated pull rate range and the second rated pull rate may be obtained in a similar manner. This is not limited herein.

When the sense amplifier 10 is at the amplification stage, the voltage of the bit line 40 or the reference bit line 50 is pulled at a pull rate within the first rated pull rate range, and the voltage of the reference bit line 50 or the bit line 40 is pulled at a pull rate within the second rated pull rate range. When the sense amplifier 10 is at a restore stage, the external read circuit reads data presented on the bit line 40 and the reference bit line 50. In this case, the data stored in the memory cell 21 has been stably presented on the bit line 40 and the reference bit line 50, such that the external data read circuit can accurately read the data presented on the bit line 40 and the reference bit line 50.

In the foregoing embodiment, the controlled power supply module controls rates at which the amplification module pulls the voltage of the bit line 40 and the voltage of the reference bit line 50, such that the pull rates of the voltage of the bit line 40 and the voltage of the reference bit line 50 are within a rated pull rate range, and the data stored in the memory cell has been stably presented on the bit line 40 and the reference bit line 50 when the external read circuit reads the data presented on the bit line 40 and the reference bit line 50, thereby further improving a data read success rate and data read accuracy.

Figure 5:
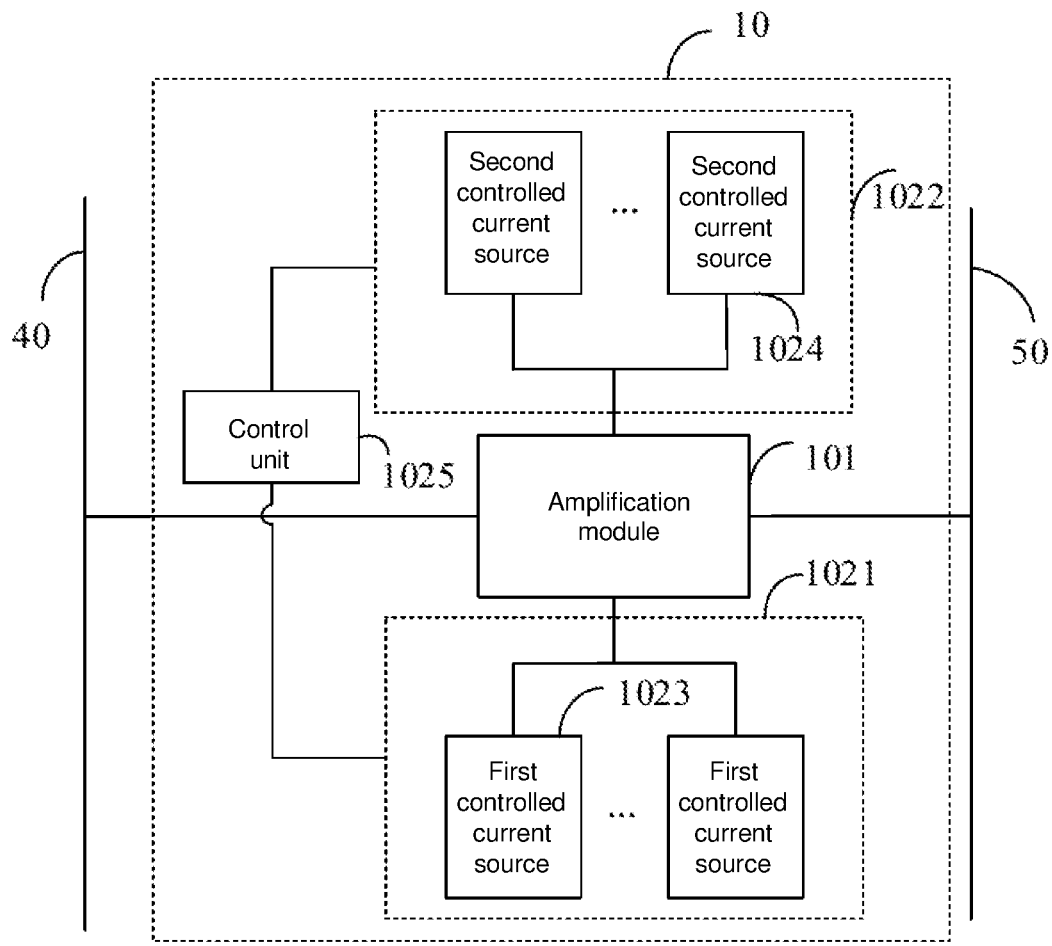
FIG. 5 is a schematic diagram of a circuit structure of a sense amplifier according to another embodiment of the present application.

As shown in FIG. 5, another embodiment of the present application provides a sense amplifier 10, the sense amplifier 10 includes an amplification module 101 and a controlled power supply module 102, and the amplification module 101 is connected to the controlled power supply module 102.

The controlled power supply module 102 includes a first controlled power supply unit 1021, a second controlled power supply unit 1022, and a control unit 1025. The amplification module 101 is provided with a first terminal, a second terminal, a third terminal, and a fourth terminal.

An output terminal of the first controlled power supply unit 1021 is connected to the first terminal of the amplification module 101, an output terminal of the second controlled power supply unit 1022 is connected to the second terminal of the amplification module 101, the third terminal of the amplification module 101 is connected to a bit line, and the fourth terminal of the amplification module is connected to a reference bit line. The control unit 1025 is connected to a control terminal of the first controlled power supply unit 1021, and the control unit 1025 is further connected to a control terminal of the second controlled power supply unit 1022.

Both the first controlled power supply unit 1021 and the second controlled power supply unit 1022 are configured to supply power to the amplification module 101. The control unit 1025 is configured to determine a drive parameter according to a first rated pull rate and a second rated pull rate, and control, according to a drive parameter, a first controlled current source 1023 and a second controlled current source 1024 to supply power to the amplification module 101.

Under control of the first controlled power supply unit 1021 and the second controlled power supply unit 1022, the amplification module 101 pulls a voltage of the bit line 40 or a voltage of the reference bit line 50 to a first preset value at a first rated pull rate and pulls the voltage of the reference bit line 50 or the voltage of the bit line 40 to a second preset value at a second rated pull rate at an amplification stage.

For ease of description, it is specified herein that a voltage provided by the first controlled power supply unit 1021 is higher than a voltage provided by the second controlled power supply unit 1022, and data "1" is presented when the voltage of the bit line 40 is higher than the voltage of the reference bit line 50.

When data stored in a memory cell 21 is "1", the first controlled power supply unit 1021 controls the amplification module 101 to pull the voltage of the bit line 40 to the first preset value at the first rated pull rate, and the second controlled power supply unit 1022 controls the amplification module 101 to pull the voltage of the reference bit line 50 to the second preset value at the second rated pull rate. When data stored in a memory cell 21 is "0", the first controlled power supply unit 1021 controls the amplification module 101 to pull the voltage of the reference bit line 50 to the first preset value at the first rated pull rate, and the second controlled power supply unit 1022 controls the amplification module 101 to pull the voltage of the bit line 40 to the second preset value at the second rated pull rate. The first preset value may be, for example, $V_{CC}$, and the second preset value may be, for example, 0.

When the sense amplifier 10 is at the amplification stage, the voltage of the bit line 40 or the voltage of the reference bit line 50 is pulled at a pull rate within the first rated pull rate range, and the voltage of the reference bit line 50 or the voltage of the bit line 40 is pulled at a pull rate within the second rated pull rate range. When the sense amplifier 10 is at a restore stage, the external read circuit reads data presented on the bit line 40 and the reference bit line 50. In this case, the data stored in the memory cell 21 has been stably presented on the bit line 40 and the reference bit line 50, such that the external data read circuit can accurately read the data presented on the bit line 40 and the reference bit line 50.

In another embodiment, the first controlled power supply unit 1021 includes N first controlled current sources 1023. Each first controlled current source 1023 is provided with a control terminal, a first terminal, and a second terminal. The second terminal of each first controlled current source 1023 is the output terminal of the first controlled power supply unit 1021, and the control terminal of each first controlled current source 1023 is the control terminal of the first controlled power supply unit 1021. The first terminal of the first controlled current source 1023 is connected to a first power supply terminal, the second terminal of the first controlled current source 1023 is connected to the first terminal of the amplification module 101, and the control terminal of the first controlled current source 1023 is connected to the control unit 1025, where N is a positive integer.

The second controlled power supply unit 1022 includes N second controlled current sources 1024, and the second controlled current source 1024 is provided with a control terminal, a first terminal, and a second terminal. The second terminal of each second controlled current source 1024 is the output terminal of the second controlled power supply unit 1022, and the control terminal of each second controlled current source 1024 is the control terminal of the second controlled power supply unit 1022. The first terminal of the second controlled current source 1024 is connected to a second power supply terminal, the second terminal of the second controlled current source 1024 is connected to the second terminal of the amplification module 101, and the control terminal of the second controlled current source 1024 is connected to the control unit 1025.

For ease of description of work states of the first controlled current source 1023 and the second controlled current source 1024, it is continuously specified herein that when a voltage of the first power supply terminal is higher than a voltage of the second power supply terminal, and the voltage of the bit line 40 is higher than the voltage of the reference bit line 50, it presents data "1".

When the data stored in the memory cell 21 is "1", the control unit 1025 is configured to: determine a first drive current range according to the first rated pull rate range, and select at least one first target current source in the N first controlled current sources 1023, such that a total current provided by the at least one first target current source is within the first drive current range; and generate a first control signal used to control the first target current source to work, such that the first controlled power supply unit 1021 controls the amplification module 101 to pull the voltage of the bit line 40 to the first preset value at the first rated pull rate at the amplification stage.

The control unit 1025 is further configured to: determine a second drive current range according to the second rated pull rate range, and select at least one second target current source in the N second controlled current sources 1024, such that a total current provided by the at least one second target current source is within the second drive current range; and generate a second control signal used to control the second target current source to work, such that the second controlled power supply unit 1022 controls the amplification module 101 to pull the voltage of the reference bit line 50 to the second preset value at the second rated pull rate at the amplification stage.

When the data stored in the memory cell 21 is "0", the control unit 1025 is configured to determine a first drive current range according to the first rated pull rate range, and select at least one first target current source in the N first controlled current sources 1023, such that a total current provided by the at least one first target current source is within the first drive current range; and generate a third control signal used to control the first target current source to work, such that the first controlled power supply unit 1022 controls the amplification module 101 to pull the voltage of the reference bit line 50 to the first preset value at the first rated pull rate at the amplification stage.

The control unit 1025 is further configured to: determine a second drive current range according to the second rated pull rate range, and select at least one second target current source in the N second controlled current sources 1024, such that a total current provided by the at least one second target current source is within the second drive current range; and generate a fourth control signal used to control the second target current source to work, such that the second controlled power supply unit 1021 controls the amplification module 101 to pull the voltage of the bit line 40 to the second preset value at the second rated pull rate at the amplification stage.

In another embodiment, an $i^{th}$ first controlled current source 1023 provides a drive current $2^{i-1} \times I_b$, a $j^{th}$ second controlled current source 1024 provides a drive current $2^{j-1} \times I_b$, and $I_b$ represents a unit current. The N first controlled current sources 1023 may provide $2^N-1$ levels of drive current, and the N second controlled current sources 1024 may also provide $2^N-1$ levels of drive current. Rates at which the amplification module 101 pulls the voltage of the bit line 40 and the voltage of the reference bit line 50 can be accurately adjusted by adjusting an amplitude value of the unit current, to pull the voltage of the bit line 40 or the voltage of the reference bit line 50 to the first preset value at the first rated pull rate and pull the voltage of the reference bit line 50 or the voltage of the bit line 40 to the second preset value at the second rated pull rate at the amplification stage.

In the foregoing embodiment, the first controlled power supply unit controls the amplification module to pull the voltage of the bit line 40 or the voltage of the reference bit line 50 at the first rated pull rate, and the second controlled power supply unit controls the amplification module to pull the voltage of the reference bit line 50 or the voltage of the bit line 40 at the second rated pull rate, such that data stored in the memory cell has been stably presented on the bit line 40 and the reference bit line 50 when the external read circuit reads the data presented on the bit line 40 and the reference bit line 50 at the restore stage, and the external data read circuit can accurately read the data presented on the bit line 40 and the reference bit line 50.

Figure 6:
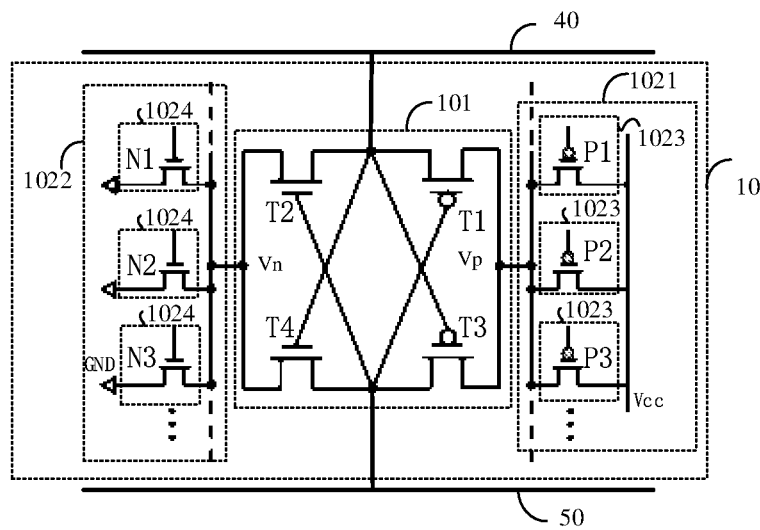
FIG. 6 is a schematic diagram of a circuit structure of a sense amplifier according to another embodiment of the present application.

As shown in FIG. 6, an embodiment of the present application provides a sense amplifier 10, the sense amplifier 10 includes an amplification module 101 and a controlled power supply module 102, and the amplification module 101 is connected to the controlled power supply module 102.

The amplification module 101 includes at least one cross-coupled amplifier circuit, each cross-coupled amplifier circuit is provided with a first terminal, a second terminal, a third terminal, and a fourth terminal, the first terminal of the cross-coupled amplifier circuit is connected to an output terminal of a first controlled power supply unit 1021, the second terminal of the cross-coupled amplifier circuit is connected to an output terminal of the second controlled power supply unit 1022, the third terminal of the cross-coupled amplifier circuit is connected to a bit line 40, and the fourth terminal of the cross-coupled amplifier circuit is connected to a reference bit line 50.

The cross-coupled amplifier circuit includes: a first transistor T1, a second transistor T2, a third transistor T3, and a fourth transistor T4.

A first terminal of the first transistor T1 is the first terminal of the cross-coupled amplifier circuit, a second terminal of the second transistor T2 is the second terminal of the cross-coupled amplifier circuit, a second terminal of the first transistor T1 is the third terminal of the cross-coupled amplifier circuit, and a second terminal of the third transistor T3 is the fourth terminal of the cross-coupled amplifier circuit.

The second terminal of the first transistor T1 is connected to a first terminal of the second transistor T2, the second terminal of the third transistor T3 is connected to a first terminal of the fourth transistor T4, the first terminal of the first transistor T1 is connected to a first terminal of the third transistor T3, and the second terminal of the second transistor T2 is connected to a second terminal of the fourth transistor T4.

A control terminal of the first transistor T1 is connected to the second terminal of the third transistor T3, a control terminal of the second transistor T2 is connected to the second terminal of the third transistor T3, a control terminal of the third transistor T3 is connected to the second terminal of the first transistor T1, and a control terminal of the fourth transistor T4 is connected to the second terminal of the first transistor T1.

The first transistor T1 and the third transistor T3 are P-type transistors, and the second transistor T2 and the fourth transistor T4 are N-type transistors.

The controlled power supply module 102 includes the first controlled power supply unit 1021 and the second controlled power supply unit 1022, the first controlled power supply unit 1021 includes N first controlled current sources 1023, and the second controlled power supply unit 1022 includes N second controlled current sources 1024.

The first controlled current source 1023 is a P-type transistor, and the second controlled current source 1024 is an N-type transistor.

A process of reading data "1" from one memory cell 21 in a first storage array 20 is described below.

At a precharge stage, both a voltage of the bit line 40 of the first storage array 20 and a voltage of the reference bit line 50 are pulled up to a reference voltage, and the reference voltage may be a voltage $0.5V_{CC}$ of a fixed power supply connected to the storage capacitor C.

At an access stage, a signal on a word line corresponding to the accessed memory cell 21 is controlled, such that an access transistor T in the accessed memory cell 21 is on, and the storage capacitor C pulls the voltage of the bit line 40 to rise.

At an amplification stage, the voltage of the bit line 40 is higher than the reference voltage, such that the first transistor T1 and the fourth transistor T4 are on, and the second transistor T2 and the third transistor T3 are off. If the first transistor T1 is on and the third transistor T3 is off, the first controlled power supply unit 1021 pulls the voltage of the bit line 40 up to a first preset value. In addition, the first controlled power supply unit 1021 includes a plurality of P-type transistors. In this case, a rate at which the first controlled power supply unit 1021 pulls the voltage of the bit line 40 and that is used when the first transistor T1 is on may be controlled by controlling a quantity of P-type transistors in an on state.

If the second transistor T2 is off and the fourth transistor T4 is on, the second controlled power supply unit 1022 pulls to the voltage of the reference bit line 50 down to a second preset value. In addition, the second controlled power supply unit 1022 includes a plurality of N-type transistors. In this case, a rate at which the second controlled power supply unit 1022 pulls the voltage of the reference bit line 50 and that is used when the fourth transistor T4 is off may be controlled by controlling a quantity of N-type transistors in an on state.

The quantity of P-type transistors in the on state in the first controlled power supply unit 1021 and the quantity of N-type transistors in the on state in the second controlled power supply unit 1022 are controlled, such that the voltage of the bit line 40 is pulled to the first preset value at a first rated pull rate and the voltage of the reference bit line 50 is pulled to the second preset value at a second rated pull rate, and a voltage difference between the bit line 40 and the reference bit line 50 can stably reflect that data in the accessed memory cell 21 is "1".

At the restore stage, the sense amplifier 10 has stabilized the voltage of the bit line 40 and the voltage of the reference bit line 50 at logical data "1", the bit line 40 charges the storage capacitor C, and after a specific time of charging, charge in the storage capacitor C is restored to a state before the read operation. Then, a signal inside a line is selected through a control column, such that an external read circuit may read the data stored in the accessed memory cell 21 on the bit line 40 and the reference bit line 50.

In another embodiment, an $i^{th}$ P-type transistor in the first controlled power supply unit 1021 may provide a drive current $2^{i-1} \times I_b$, a $j^{th}$ N-type transistor in the second controlled power supply unit 1022 may provide a drive current $2^{j-1} \times I_b$, and $I_b$ represents a unit current. The first controlled power supply unit 1021 may provide $2^N-1$ levels of drive current, and the second controlled power supply unit 1022 may also provide $2^N-1$ levels of drive current, such that the controlled power supply module 102 can provide $2^N-1$ levels of drive current.

A level of a drive current that may be provided by the controlled power supply module 102 is described by using an example below. The first controlled power supply unit 1021 includes three P-type transistors. A drive current that may be provided by the $1^{st}$ P-type transistor is $I_b$, a drive current that may be provided by the $2^{nd}$ P-type transistor is $2I_b$, and a drive current that may be provided by the $3^{rd}$ P-type transistor is $4I_b$. The second controlled power supply unit 1022 includes three N-type transistors. A drive current that may be provided by the $1^{st}$ N-type transistor is $I_b$, a drive current that may be provided by the $2^{nd}$ N-type transistor is $2I_b$, and a drive current that may be provided by the $3^{rd}$ N-type transistor is $4I_b$.

The controlled power supply module 102 may provide 7 levels of drive current. Control signals of N-type transistors and P-type transistors at each level are shown in Table 1 and Table 2. "1" represents a high level control signal and "0" represents a low level control signal.

TABLE 1

Control signal of an N-type transistor

| $3^{rd}$ N-type transistor | $2^{nd}$ N-type transistor | $1^{st}$ N-type transistor | Level of a drive current |
|---|---|---|---|
| 0 | 0 | 1 | $I_b$ |
| 0 | 1 | 0 | $2I_b$ |
| 0 | 1 | 1 | $3I_b$ |
| 1 | 0 | 0 | $4I_b$ |
| 1 | 0 | 1 | $5I_b$ |
| 1 | 1 | 0 | $6I_b$ |
| 1 | 1 | 1 | $7I_b$ |

TABLE 2

Control signal of a P-type transistor

| $3^{rd}$ P-type transistor | $2^{nd}$ P-type transistor | $1^{st}$ P-type transistor | Level of a drive current |
|---|---|---|---|
| 1 | 1 | 0 | $I_b$ |
| 1 | 0 | 1 | $2I_b$ |
| 1 | 0 | 0 | $3I_b$ |
| 0 | 1 | 1 | $4I_b$ |
| 0 | 1 | 0 | $5I_b$ |
| 0 | 0 | 1 | $6I_b$ |
| 0 | 0 | 0 | $7I_b$ |

In the foregoing technical solution, the quantity of P-type transistors in the on state and the quantity of N-type transistors in the on state are controlled, to control the controlled power supply module to provide a level of a drive current to the amplification module, so as to control rates at which the amplification module pulls the voltage of the bit line 40 and the voltage of the reference bit line 50 to be in a rated range, such that the bit line 40 and the reference bit line 50 can stably present the data stored in the memory cell at the restore stage, thereby improving data read accuracy and a data read success rate.

Figure 7:
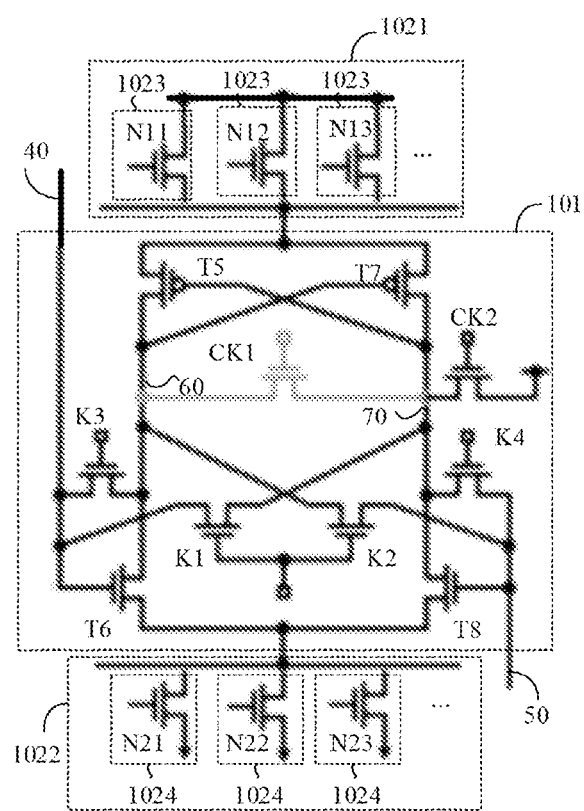
FIG. 7 is a schematic diagram of a circuit structure of a sense amplifier according to another embodiment of the present application.

As shown in FIG. 7, an embodiment of the present application provides a sense amplifier 10, the sense amplifier 10 includes an amplification module 101 and a controlled power supply module 102, and the amplification module 101 is connected to the controlled power supply module 102.

The amplification module 101 includes at least one cross-coupled amplifier circuit, each cross-coupled amplifier circuit is provided with a first terminal, a second terminal, a third terminal, and a fourth terminal, the first terminal of the cross-coupled amplifier circuit is connected to an output terminal of a first controlled power supply unit 1021, the second terminal of the cross-coupled amplifier circuit is connected to an output terminal of the second controlled power supply unit 1022, the third terminal of the cross-coupled amplifier circuit is connected to a bit line 40, and the fourth terminal of the cross-coupled amplifier circuit is connected to a reference bit line 50.

The cross-coupled amplifier circuit has an offset elimination function, and the cross-coupled amplifier circuit specifically includes: a fifth transistor T5, a sixth transistor T6, a seventh transistor T7, an eighth transistor T8, a first switch K1, a second switch K2, a third switch K3, and a fourth switch K4.

A first terminal of the fifth transistor T5 is the first terminal of the cross-coupled amplifier circuit, a second terminal of the sixth transistor T6 is the second terminal of the cross-coupled amplifier circuit, a second terminal of the fifth transistor T5 is the third terminal of the cross-coupled amplifier circuit, and a second terminal of the seventh transistor T7 is the fourth terminal of the cross-coupled amplifier circuit.

The second terminal of the fifth transistor T5 is connected to a first terminal of the sixth transistor T6, the second terminal of the seventh transistor T7 is connected to a first terminal of the eighth transistor T8, the first terminal of the fifth transistor T5 is connected to a first terminal of the seventh transistor T7, and the second terminal of the sixth transistor T6 is connected to a second terminal of the eighth transistor T8.

A control terminal of the fifth transistor T5 is connected to the second terminal of the seventh transistor T7, a control terminal of the sixth transistor T6 is connected to the second terminal of the seventh transistor T7 through the first switch K1, and the control terminal of the sixth transistor T6 is connected to the first terminal of the sixth transistor T6 through the third switch K3.

A control terminal of the seventh transistor T7 is connected to the second terminal of the fifth transistor T5, a control terminal of the eighth transistor T8 is connected to the second terminal of the fifth transistor T5 through the second switch K2, and the control terminal of the eighth transistor T8 is connected to the first terminal of the eighth transistor T8 through the fourth switch K4.

The fifth transistor T5 and the seventh transistor T7 are P-type transistors, and the sixth transistor T6 and the eighth transistor T8 are N-type transistors.

The controlled power supply module 102 includes the first controlled power supply unit 1021 and the second controlled power supply unit 1022, the first controlled power supply unit 1021 includes N first controlled current sources 1023, and the second controlled power supply unit 1022 includes N second controlled current sources 1024. The first controlled current source 1023 is a P-type transistor, and the second controlled current source 1024 is a P-type transistor.

Different from that in the embodiment shown in FIG. 6, a data read process of the sense amplifier provided in this embodiment further includes an offset elimination stage. For ease of description, a connection line between the second terminal of the fifth transistor T5 and the first terminal of the sixth transistor T6 is referred to as an internal bit line 70 of a first storage array 20, and a connection line between the second terminal of the seventh transistor T7 and the first terminal of the eighth transistor T8 is referred to as an internal reference bit line 60 of the first storage array 20.

Figure 8:
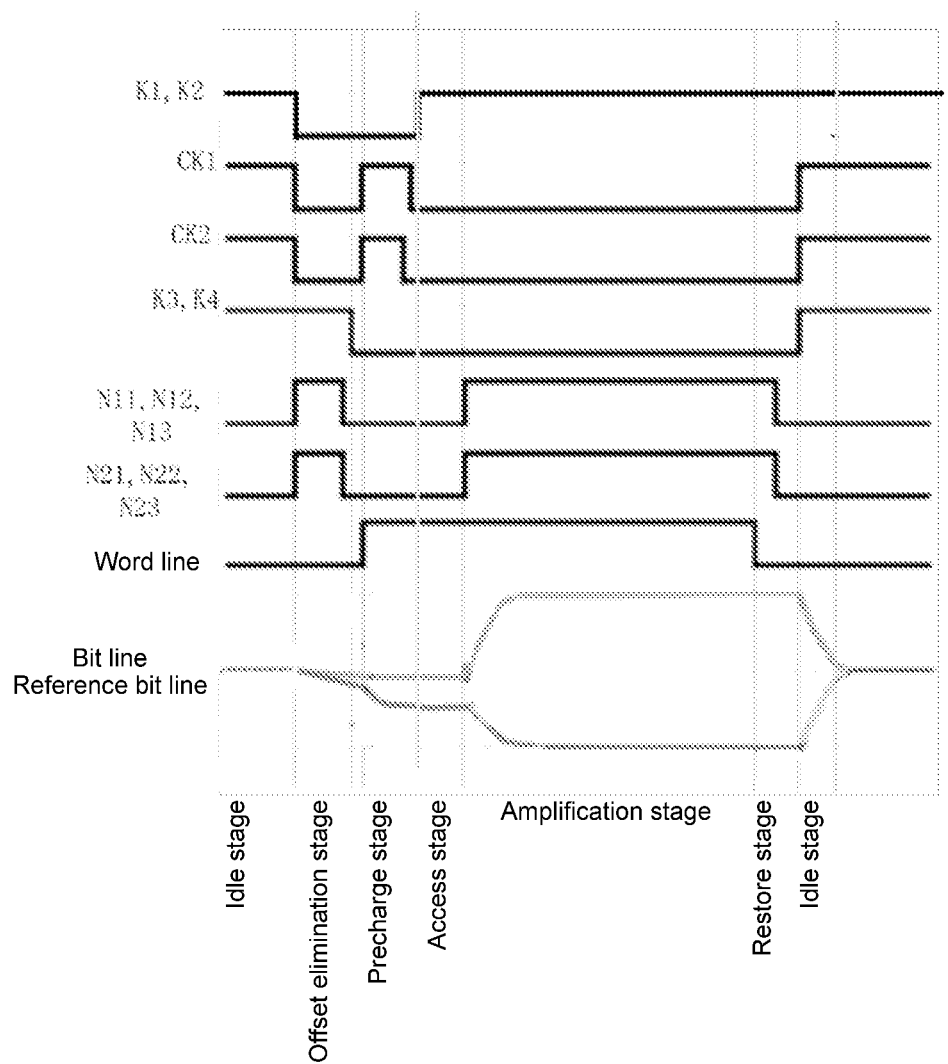
FIG. 8 is a time sequence diagram of data read according to another embodiment of the present application.

A process of reading data "1" from one memory cell 21 in the first storage array 20 is described below. As shown in FIG. 8, reading data includes an idle stage, an offset elimination stage, a precharge stage, an access stage, an amplification stage, and a restore stage.

At the idle stage, the third switch K3 and the fourth switch K4 are closed, and the first switch K1 and the second switch K2 are also closed. The first terminal of the sixth transistor T6 is short circuited to the control terminal, and the first terminal of the eighth transistor T8 is short circuited to the control terminal. The charge switches CK1 and CK2 are closed, and the internal bit line 70 and the internal reference bit line 60 are charged through a charge power supply. In this case, in an embodiment, the bit line 40, the reference bit line 50, the internal bit line 70, and the internal reference bit line 60 are all charged to $0.5V_{CC}$.

At the offset elimination stage, the first switch K1 and the second switch K2 are disconnected, and the third switch K3 and the fourth switch K4 are still closed. At least one N-type transistor of N11, N12, N13 is controlled according to a waveform in the figure, and at least one N-type transistor of N21, N22, N23 is controlled according to a waveform in the figure, such that the first controlled power supply unit 1021 and the second controlled power supply unit 1022 supply power to the cross-coupled amplifier circuit. In addition, the sixth transistor T6 is connected to the eighth transistor T8 through a diode. A compensation voltage occurs on the bit line 40 and the reference bit line 50, and the compensation voltage may eliminate a manufacturing difference in the N-type transistor or the P-type transistor (which may be referred to as an offset voltage). For example, the voltage on the bit line 40 minus the voltage on the reference bit line 50 equals the offset voltage, or the voltage on the reference bit line 50 minus the voltage on the bit line 40 equals the offset voltage.

At the precharge stage, the first switch K1 to the fourth switch K4 are all disconnected. Both a voltage of the internal bit line 70 of the first storage array 20 and a voltage of the internal reference bit line 60 are pulled up to a reference voltage, and the reference voltage is a voltage of a fixed power supply connected to the storage capacitor C. In an embodiment, the voltage of the fixed power supply is $0.5V_{CC}$.

At the access stage, the first switch K1 and the second switch K2 are closed, the third switch K3 and the fourth switch K4 are still disconnected, and the compensation voltage is still reserved on the bit line 40 and the reference bit line 50. For example, at the offset elimination stage, the voltage on the bit line 40 is higher than the voltage of the reference bit line 50, and a difference is a compensation voltage Vos. At the access stage, the voltage on the bit line 40 is still higher than the voltage of the reference bit line 50, and a difference is also the compensation voltage Vos. If an offset between threshold voltages of T6 and T8 is Vos, an offset between threshold voltages of T5 and T7 is Vos, or an offset between threshold voltages that occur on T6 and T5 together with T8 and T7 is Vos, at the access stage, impact of Vos on the sense amplifier is eliminated or at least weakened.

At the access stage, a signal on a word line corresponding to the accessed memory cell 21 is controlled, such that an access transistor T in the accessed memory cell 21 is on, and the storage capacitor C enables the voltage of the bit line 40 to rise.

Cases at the amplification stage and the restore stage are the same as those in the embodiment shown in FIG. 6, and details are not described herein again.

In the foregoing technical solution, a quantity of transistors in an on state is controlled, to control the controlled power supply module to provide a level of a drive current to the amplification module, so as to control rates at which the amplification module pulls the voltage of the bit line 40 and the voltage of the reference bit line 50 to be in a rated range, such that the bit line 40 and the reference bit line 50 can stably present the data stored in the memory cell at the restore stage, thereby improving data read accuracy and a data read success rate.

Figure 9:
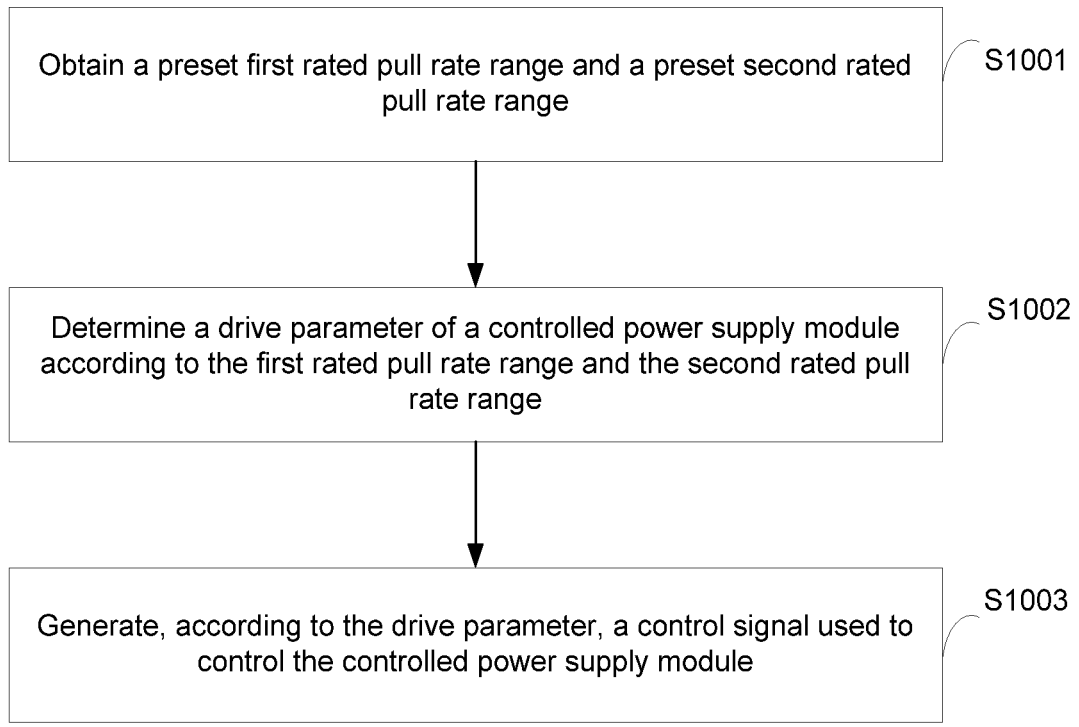
FIG. 9 is a schematic diagram of a procedure of a control method of a sense amplifier according to another embodiment of the present application.

As shown in FIG. 9, the present application provides a control method of a sense amplifier. A structure of the sense amplifier has been described in detail in the foregoing embodiment, and details are not described herein again. The control method specifically includes the following step.

S1001. Obtain a preset first rated pull rate range and a preset second rated pull rate range.

The first rated pull rate range and the second rated pull rate range are determined according to a time sequence of selected signals on a column selection line, a time sequence of signals on a word line connected to the memory cell, and voltages of a bit line and a reference bit line. The first rated pull rate range and the second rated pull rate range may be further obtained by testing the sense amplifier, to ensure that data on the bit line and the reference bit line can be accurately read.

S1002. Determine a drive parameter of a controlled power supply module according to the first rated pull rate range and the second rated pull rate range.

The sense amplifier is tested, to obtain a mapping relationship between pull rates at which the sense amplifier pulls a voltage of the bit line and a voltage of the reference bit line and a drive parameter of the controlled power supply module, and then the drive parameter of the controlled power supply module is determined according to the mapping relationship and the two rated pull rate ranges.

S1003. Generate, according to the drive parameter, a control signal used to control the controlled power supply module.

After the drive parameter of the controlled power supply module is obtained, the control signal is generated according to the drive parameter, to control the controlled power supply module to supply power to an amplification module according to the drive parameter, and further control the controlled power supply module to control the amplification module to pull the voltage of the bit line or the voltage of the reference bit line to a first preset value at a first rated pull rate and pull the voltage of the reference bit line or the voltage of the bit line to a second preset value at a second rated pull rate at an amplification stage. The first rated pull rate is within the first rated pull rate range, and the second rated pull rate is within the second rated pull rate range.

In the control method provided in this embodiment of the present application, the drive parameter output by the controlled power supply module is controlled, to control rates at which the amplification module pulls the voltage of the bit line and the voltage of the reference bit line, such that the pull rates of the voltage of the bit line and the voltage of the reference bit line are within a rated pull rate range, and the data stored in the memory cell has been stably presented on the bit line and the reference bit line when the external read circuit reads the data presented on the bit line and the reference bit line, thereby further improving a data read success rate and data read accuracy.

Another embodiment of the present application provides a control method of a sense amplifier. The control method specifically includes the following step.

S2001. Obtain a preset first rated pull rate range and a preset second rated pull rate range.

The step has been described in detail in the foregoing embodiment, and details are not described herein again.

S2002. Determine a drive parameter of a controlled power supply module according to the first rated pull rate range and the second rated pull rate range.

A first drive current range is determined according to the first rated pull rate range, and a second drive current range is determined according to the second rated pull rate range. The first drive current range is a drive parameter of a first controlled current source, and the second drive current range is a drive parameter of a second controlled current source.

S2003. Generate, according to the drive parameter, a control signal used to control the controlled power supply module.

For ease of description of work states of the first controlled current source and the second controlled current source, it is continuously specified herein that when a voltage of a first power supply terminal is higher than a voltage of a second power supply terminal, and a voltage of a bit line is higher than a voltage of a reference bit line, it presents data "1".

When the data stored in the memory cell is "1", at least one first target current source is selected in N first controlled current sources, such that a total current provided by the at least one first target current source is within the first drive current range; and a first control signal used to control the first target current source to work is generated, such that a first controlled power supply unit controls an amplification module to pull the voltage of the bit line to a first preset value at a first rated pull rate at an amplification stage.

At least one second target current source is selected in N second controlled current sources, such that a total current provided by the at least one second target current source is within the second drive current range; and a second control signal used to control the second target current source to work is generated, such that a second controlled power supply unit controls the amplification module to pull the voltage of the reference bit line to a second preset value at a second rated pull rate at the amplification stage.

When the data stored in the memory cell 21 is "0", at least one first target current source is selected in N first controlled current sources, such that a total current provided by the at least one first target current source is within the first drive current range; and a third control signal used to control the first target current source to work is generated, such that a first controlled power supply unit controls an amplification module to pull the voltage of the reference bit line to a first preset value at a first rated pull rate at an amplification stage.

At least one second target current source is selected in N second controlled current sources, such that a total current provided by the at least one second target current source is within the second drive current range; and a fourth control signal used to control the second target current source to work is generated, such that a second controlled power supply unit controls the amplification module to pull the voltage of the bit line to a second preset value at a second rated pull rate at the amplification stage.

In the foregoing embodiment, the first controlled power supply unit controls the amplification module to pull the voltage of the bit line or the voltage of the reference bit line at the first rated pull rate, and the second controlled power supply unit controls the amplification module to pull the voltage of the reference bit line or the voltage of the bit line at the second rated pull rate, such that data stored in the memory cell has been stably presented on the bit line and the reference bit line when an external read circuit reads the data presented on the bit line and the reference bit line at a restore stage, and the external data read circuit can accurately read the data presented on the bit line and the reference bit line.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the technical solutions of the embodiments of the present application.

The invention claimed is:

1. A sense amplifier, comprising:
an amplification circuit, configured to: when the sense amplifier is at an amplification stage, amplify a voltage difference between a bit line and a reference bit line; and
a controlled power supply circuit, connected to the amplification circuit, and configured to: determine a drive current range between a first value and a second value smaller than the first value according to a first rated pull rate range at an amplification stage and a second rated pull rate range at the amplification stage, and supply power to the amplification circuit according to the drive current range, to control the amplification circuit to pull a voltage of the bit line or a voltage of the reference bit line to a first preset value at a first rated pull rate at the amplification stage and pull the voltage of the reference bit line or the voltage of the bit line to a second preset value at a second rated pull rate at the amplification stage, wherein
the first rated pull rate is within the first rated pull rate range, and the second rated pull rate is within the second rated pull rate range; and
the controlled power supply circuit is further configured to determine the drive current range according to the first rated pull rate range and the second rated pull rate range in the following manner: testing the sense amplifier to obtain a mapping relationship between pull rates at which the bit line and the reference bit line are pulled at the amplification stage and the drive current range, and determining the drive current range according to the mapping relationship, the first rated pull rate range, and the second rated pull rate range.

2. The sense amplifier of claim 1, wherein the controlled power supply circuit comprises:
a first controlled power supply circuit, connected to a first terminal of the amplification circuit, and configured to supply power to the amplification circuit;
a second controlled power supply circuit, connected to a second terminal of the amplification circuit, and configured to supply power to the amplification circuit; and
a controller, connected to the first controlled power supply circuit, further connected to the second controlled power supply circuit, and configured to: determine the drive current range according to the first rated pull rate range and the second rated pull rate range, and control, according to the drive current range, one or more first controlled current sources and one or more second controlled current sources to supply power to the amplification circuit.

3. The sense amplifier of claim 2, wherein the first controlled power supply circuit comprises:
N first controlled current sources, wherein each of the first controlled current sources is provided with a control terminal, a first terminal, and a second terminal, the first terminal of the first controlled current source is connected to a first power supply terminal, the second terminal of the first controlled current source is connected to the first terminal of the amplification circuit, and the control terminal of the first controlled current source is connected to the controller, wherein N is a positive integer.

4. The sense amplifier of claim 3, wherein the second controlled power supply circuit comprises:
N second controlled current sources, wherein each of the second controlled current sources is provided with a control terminal, a first terminal, and a second terminal, the first terminal of the second controlled current source is connected to a second power supply terminal, the second terminal of the second controlled current source is connected to the second terminal of the amplification circuit, and the control terminal of the second controlled current source is connected to the controller.

5. The sense amplifier of claim 4, wherein the controller is configured to:
determine a first drive current range according to the first rated pull rate range, and determine a second drive current range according to the second rated pull rate range;
select at least one first target current source from the N first controlled current sources, and select at least one second target current source from the N second controlled current sources, wherein a total current provided by the at least one first target current source is within the first drive current range, and a total current provided by the at least one second target current source is within the second drive current range; and
generate a first control signal used to control the at least one first target current source to work, and generate a second control signal used to control the at least one second target current source to work, such that the first controlled power supply circuit controls the amplification circuit to pull the voltage of the bit line to the first preset value at the first rated pull rate at the amplification stage, and the second controlled power supply circuit controls the amplification circuit to pull the voltage of the reference bit line to the second preset value at the second rated pull rate at the amplification stage.

6. The sense amplifier of claim 4, wherein the controller is configured to:
determine a first drive current range according to the first rated pull rate range, and determine a second drive current range according to the second rated pull rate range;
select at least one first target current source from the N first controlled current sources, and select at least one second target current source from the N second controlled current sources, wherein a total current provided by the at least one first target current source is within the second drive current range, and a total current provided by the at least one second target current source is within the first drive current range; and
generate a third control signal used to control the at least one first target current source to work, and generate a fourth control signal used to control the at least one second target current source to work, such that the first controlled power supply circuit controls the amplification circuit to pull the voltage of the reference bit line to the first preset value at the first rated pull rate at the amplification stage, and the second controlled power supply circuit controls the amplification circuit to pull the voltage of the bit line to the second preset value at the second rated pull rate at the amplification stage.

7. The sense amplifier of claim 4, wherein a drive current provided by an $i^{th}$ first controlled current source is $2^{i-1} \times I_b$, a drive current provided by a $j^{th}$ second controlled current source is $2^{j-1} \times I_b$, and $I_b$ represents a unit current.

8. The sense amplifier of claim 2, wherein
the one or more first controlled current sources comprise a P-type transistor, and the one or more second controlled current sources comprise source is an N-type transistor; or
the one or more first controlled current sources and the one or more second controlled current sources comprise N-type transistors.

9. The sense amplifier of claim 2, wherein the amplification circuit comprises:
at least one cross-coupled amplifier circuit, wherein the cross-coupled amplifier circuit is provided with a first terminal, a second terminal, a third terminal, and a fourth terminal, the first terminal of the cross-coupled amplifier circuit is connected to an output terminal of the first controlled power supply circuit, the second terminal of the cross-coupled amplifier circuit is connected to an output terminal of the second controlled power supply circuit, the third terminal of the cross-coupled amplifier circuit is connected to the bit line, and the fourth terminal of the cross-coupled amplifier circuit is connected to the reference bit line.

10. The sense amplifier of claim 9, wherein the cross-coupled amplifier circuit comprises: a first transistor, a second transistor, a third transistor, and a fourth transistor;
a first terminal of the first transistor is the first terminal of the cross-coupled amplifier circuit, a second terminal of the second transistor is the second terminal of the cross-coupled amplifier circuit, a second terminal of the first transistor is the third terminal of the cross-coupled amplifier circuit, and a second terminal of the third transistor is the fourth terminal of the cross-coupled amplifier circuit;
the second terminal of the first transistor is connected to a first terminal of the second transistor, the second terminal of the third transistor is connected to a first terminal of the fourth transistor, the first terminal of the first transistor is connected to a first terminal of the third transistor, and the second terminal of the second transistor is connected to a second terminal of the fourth transistor; and
a control terminal of the first transistor is connected to the second terminal of the third transistor, a control terminal of the second transistor is connected to the second terminal of the third transistor, a control terminal of the third transistor is connected to the second terminal of the first transistor, and a control terminal of the fourth transistor is connected to the second terminal of the first transistor.

11. The sense amplifier of claim 9, wherein the cross-coupled amplifier circuit comprises: a fifth transistor, a sixth transistor, a seventh transistor, an eighth transistor, a first switch, a second switch, a third switch, and a fourth switch;
a first terminal of the fifth transistor is the first terminal of the cross-coupled amplifier circuit, a second terminal of the sixth transistor is the second terminal of the cross-coupled amplifier circuit, a second terminal of the fifth transistor is the third terminal of the cross-coupled amplifier circuit, and a second terminal of the seventh transistor is the fourth terminal of the cross-coupled amplifier circuit;
the second terminal of the fifth transistor is connected to a first terminal of the sixth transistor, the second terminal of the seventh transistor is connected to a first terminal of the eighth transistor, the first terminal of the fifth transistor is connected to a first terminal of the seventh transistor, and the second terminal of the sixth transistor is connected to a second terminal of the eighth transistor;

a control terminal of the fifth transistor is connected to the second terminal of the seventh transistor, a control terminal of the sixth transistor is connected to the second terminal of the seventh transistor through the first switch, and the control terminal of the sixth transistor is connected to the first terminal of the sixth transistor through the third switch; and a control terminal of the seventh transistor is connected to the second terminal of the fifth transistor, a control terminal of the eighth transistor is connected to the second terminal of the fifth transistor through the second switch, and the control terminal of the eighth transistor is connected to the first terminal of the eighth transistor through the fourth switch.

12. The sense amplifier of claim 2, wherein in response to the amplification circuit pulling the voltage of the bit line or the voltage of the reference bit line to the first preset value at the first rated pull rate and pulling the voltage of the reference bit line or the voltage of the bit line to the second preset value at the second rated pull rate, the voltage of the bit line is decreased from an initial voltage of the bit line at the beginning of the amplification stage to reach a minimal value before the one or more first controlled current sources is pulled to the first preset value, and then is increased to reach the first preset value, and the voltage of the reference bit line is successively decreased from an initial voltage of the reference bit line at the beginning of the amplification stage to reach the second preset value.

13. A memory, comprising the sense amplifier of claim 1 and a plurality of memory cells, wherein a first plurality of memory cells of the plurality of memory cells constitute a first storage array, a second plurality of memory cells of the plurality of memory cells constitute a second storage array, the sense amplifier is located between the first storage array and the second storage array, a third terminal of the sense amplifier is connected to a bit line of the first storage array, and a fourth terminal of the sense amplifier is connected to a bit line of the second storage array.

14. A control method of a sense amplifier, wherein the sense amplifier comprises an amplification circuit and a controlled power supply circuit; and the method comprises:

obtaining a first rated pull rate range at an amplification stage and a second rated pull rate range at the amplification stage;

determining a drive current range between a first value and a second value smaller than the first value of the controlled power supply circuit according to the first rated pull rate range and the second rated pull rate range; and generating, according to the drive current range, a control signal used to control the controlled power supply circuit, such that the controlled power supply circuit controls the amplification circuit to pull a voltage of a bit line or a voltage of a reference bit line to a first preset value at a first rated pull rate at an amplification stage and pull the voltage of the reference bit line or the voltage of the bit line to a second preset value at a second rated pull rate at an amplification stage, wherein the first rated pull rate is within the first rated pull rate range, and the second rated pull rate is within the second rated pull rate range; and the determining a drive current range of the controlled power supply circuit according to the first rated pull rate range and the second rated pull rate range comprises: testing the sense amplifier to obtain a mapping relationship between pull rates at which the bit line and the reference bit line are pulled at the amplification stage and the drive current range, and determining the drive current range according to the mapping relationship, the first rated pull rate range, and the second rated pull rate range.

15. The method of claim 14, wherein the controlled power supply circuit comprises a first controlled power supply circuit and a second controlled power supply circuit, the first controlled power supply circuit comprises N first controlled current sources, and the second controlled power supply circuit comprises N second controlled current sources; and the determining a drive current range of the controlled power supply circuit according to the first rated pull rate range and the second rated pull rate range comprises:

determining a first drive current range according to the first rated pull rate range, and determining a second drive current range according to the second rated pull rate range.

16. The method of claim 15, wherein the generating, according to the drive current range, a control signal used to control the controlled power supply circuit comprises:

selecting at least one first target current source from the N first controlled current sources, and selecting at least one second target current source from the N second controlled current sources, wherein a total current provided by the at least one first target current source is within the first drive current range, and a total current provided by the at least one second target current source is within the second drive current range; and generating a first control signal used to control the at least one first target current source to work, and generating a second control signal used to control the at least one second target current source to work, such that the first controlled power supply circuit controls the amplification circuit to pull the voltage of the bit line to the first preset value at the first rated pull rate at the amplification stage, and the second controlled power supply circuit controls the amplification circuit to pull the voltage of the reference bit line to the second preset value at the second rated pull rate at the amplification stage.

17. The method of claim 15, wherein the generating, according to the drive current range, a control signal used to control the controlled power supply circuit comprises:

selecting at least one first target current source from the N first controlled current sources, and selecting at least one second target current source from the N second controlled current sources, wherein a total current provided by the at least one first target current source is within the second drive current range, and a total current provided by the at least one second target current source is within the first drive current range; and generating a third control signal used to control the at least one first target current source to work, and generating a fourth control signal used to control the at least one second target current source to work, such that the first controlled power supply circuit controls the amplification circuit to pull the voltage of the reference bit line to the first preset value at the first rated pull rate at the amplification stage, and the second controlled power supply circuit controls the amplification circuit to pull the voltage of the bit line to the second preset value at the second rated pull rate at the amplification stage.

* * * * *

UNITED STATES PATENT AND TRADEMARK OFFICE
CERTIFICATE OF CORRECTION

PATENT NO. : 12,094,562 B2
APPLICATION NO. : 17/647995
DATED : September 17, 2024
INVENTOR(S) : Hsin-Cheng Su Page 1 of 1

It is certified that error appears in the above-identified patent and that said Letters Patent is hereby corrected as shown below:

In the Claims

In Claim 8, Column 18, Line 7-8, "controlled current sources comprise source is an N-type" should read -- controlled current sources comprise an N-type --

Signed and Sealed this
Twenty-sixth Day of November, 2024

Katherine Kelly Vidal
*Director of the United States Patent and Trademark Office*